(12) United States Patent
Lafort

(10) Patent No.: US 10,951,169 B2
(45) Date of Patent: Mar. 16, 2021

(54) AMPLIFIER COMPRISING TWO PARALLEL COUPLED AMPLIFIER UNITS

(71) Applicant: Sonion Nederland B.V., Hoofddorp (NL)

(72) Inventor: Adrianus Maria Lafort, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 59 days.

(21) Appl. No.: 16/510,511

(22) Filed: Jul. 12, 2019

(65) Prior Publication Data

US 2020/0028470 A1 Jan. 23, 2020

(30) Foreign Application Priority Data

Jul. 20, 2018 (EP) .................................... 18184794

(51) Int. Cl.
| | |
|---|---|
| *H03F 1/02* | (2006.01) |
| *H03F 3/21* | (2006.01) |
| *H03F 3/181* | (2006.01) |
| *H03G 3/30* | (2006.01) |
| *H04R 3/00* | (2006.01) |

(52) U.S. Cl.
CPC .......... *H03F 1/0211* (2013.01); *H03F 1/0277* (2013.01); *H03F 3/181* (2013.01); *H03F 3/21* (2013.01); *H03G 3/30* (2013.01); *H04R 3/00* (2013.01)

(58) Field of Classification Search
CPC ...... H03F 1/0211; H03F 1/0277; H03F 3/181; H03F 3/21; H03F 2200/03; H03F 2200/297; H03F 2200/432; H03F 2200/444; H03F 2200/69; H03F 3/265; H03F 3/505; H03F 3/183; H03F 1/3205; H03G 3/30; H04R 3/00
USPC ..................................... 330/277, 295, 124 R
See application file for complete search history.

(56) References Cited

U.S. PATENT DOCUMENTS

| | | | |
|---|---|---|---|
| 6,788,796 | B1 | 9/2004 | Miles |
| 6,831,577 | B1 | 12/2004 | Furst |
| 6,853,290 | B2 | 2/2005 | Jorgensen |
| 6,859,542 | B2 | 2/2005 | Johannsen |
| 6,888,408 | B2 | 5/2005 | Furst |
| 6,914,992 | B1 | 7/2005 | van Halteren |
| 6,919,519 | B2 | 7/2005 | Ravnkilde |
| 6,930,259 | B1 | 8/2005 | Jorgensen |
| 6,943,308 | B2 | 9/2005 | Ravnkilde |

(Continued)

FOREIGN PATENT DOCUMENTS

| | | |
|---|---|---|
| EP | 1475996 A1 | 11/2004 |
| EP | 3014613 A1 | 5/2016 |

(Continued)

OTHER PUBLICATIONS

U.S. Appl. No. 16/510,457, filed Jul. 12, 2019, Egon Merks-Swolfs, An Amplifier with a Symmetric Current Profile.

(Continued)

*Primary Examiner* — Hieu P Nguyen
(74) *Attorney, Agent, or Firm* — Nixon Peabody LLP

(57) ABSTRACT

An amplifier with two parallel coupled amplifier units with inverse characteristics and in particular to the parallel coupling of a sourcing limited amplifier unit and a sinking limited amplifier unit.

20 Claims, 3 Drawing Sheets

(56) References Cited

U.S. PATENT DOCUMENTS

| | | |
|---|---|---|
| 6,974,921 B2 | 12/2005 | Jorgensen |
| 7,008,271 B2 | 3/2006 | Jorgensen |
| 7,012,200 B2 | 3/2006 | Moller |
| 7,062,058 B2 | 6/2006 | Steeman |
| 7,062,063 B2 | 6/2006 | Hansen |
| 7,072,482 B2 | 7/2006 | Van Doorn |
| 7,088,839 B2 | 8/2006 | Geschiere |
| 7,110,560 B2 | 9/2006 | Stenberg |
| 7,136,496 B2 | 11/2006 | van Halteren |
| 7,142,682 B2 | 11/2006 | Mullenborn |
| 7,181,035 B2 | 2/2007 | van Halteren |
| 7,190,803 B2 | 3/2007 | van Halteren |
| 7,206,428 B2 | 4/2007 | Geschiere |
| 7,221,767 B2 | 5/2007 | Mullenborn |
| 7,221,769 B1 | 5/2007 | Jorgensen |
| 7,227,968 B2 | 6/2007 | van Halteren |
| 7,239,714 B2 | 7/2007 | de Blok |
| 7,245,734 B2 | 7/2007 | Niederdraenk |
| 7,254,248 B2 | 8/2007 | Johannsen |
| 7,286,680 B2 | 10/2007 | Steeman |
| 7,292,700 B1 | 11/2007 | Engbert |
| 7,292,876 B2 | 11/2007 | Bosh |
| 7,336,794 B2 | 2/2008 | Furst |
| 7,376,240 B2 | 5/2008 | Hansen |
| 7,403,630 B2 | 7/2008 | Jorgensen |
| 7,415,121 B2 | 8/2008 | Mögelin |
| 7,425,196 B2 | 9/2008 | Jorgensen |
| 7,460,681 B2 | 12/2008 | Geschiere |
| 7,466,835 B2 | 12/2008 | Stenberg |
| 7,492,919 B2 | 2/2009 | Engbert |
| 7,548,626 B2 | 6/2009 | Stenberg |
| 7,657,048 B2 | 2/2010 | van Halteren |
| 7,684,575 B2 | 3/2010 | van Halteren |
| 7,706,561 B2 | 4/2010 | Wilmink |
| 7,715,583 B2 | 5/2010 | Van Halteren |
| 7,728,237 B2 | 6/2010 | Pedersen |
| 7,809,151 B2 | 10/2010 | Van Halteren |
| 7,822,218 B2 | 10/2010 | Van Halteren |
| 7,899,203 B2 | 3/2011 | Van Halteren |
| 7,912,240 B2 | 3/2011 | Madaffari |
| 7,946,890 B1 | 5/2011 | Bondo |
| 7,953,241 B2 | 5/2011 | Jorgensen |
| 7,961,899 B2 | 6/2011 | Van Halteren |
| 7,970,161 B2 | 6/2011 | van Halteren |
| 8,098,854 B2 | 1/2012 | van Halteren |
| 8,101,876 B2 | 1/2012 | Andreasen |
| 8,103,039 B2 | 1/2012 | van Halteren |
| 8,160,290 B2 | 4/2012 | Jorgensen |
| 8,170,249 B2 | 5/2012 | Halteren |
| 8,189,804 B2 | 5/2012 | Hruza |
| 8,189,820 B2 | 5/2012 | Wang |
| 8,223,996 B2 | 7/2012 | Beekman |
| 8,233,652 B2 | 7/2012 | Jorgensen |
| 8,259,963 B2 | 9/2012 | Stenberg |
| 8,259,976 B2 | 9/2012 | van Halteren |
| 8,259,977 B2 | 9/2012 | Jorgensen |
| 8,280,082 B2 | 10/2012 | van Halteren |
| 8,284,966 B2 | 10/2012 | Wilk |
| 8,313,336 B2 | 11/2012 | Bondo |
| 8,315,422 B2 | 11/2012 | van Halteren |
| 8,331,595 B2 | 12/2012 | van Halteren |
| 8,369,552 B2 | 2/2013 | Engbert |
| 8,379,899 B2 | 2/2013 | van Halteren |
| 8,509,468 B2 | 8/2013 | van Halteren |
| 8,526,651 B2 | 9/2013 | Lafort |
| 8,526,652 B2 | 9/2013 | Ambrose |
| 9,398,374 B2 | 7/2016 | Yamauchi |
| 9,402,131 B2 * | 7/2016 | Jennings .................. H04R 1/08 |
| 9,743,167 B2 | 8/2017 | Nielsen |
| 2006/0132240 A1 | 6/2006 | Tu |
| 2010/0182086 A1 | 7/2010 | Cozzolino |
| 2011/0182453 A1 | 7/2011 | van Halteren |
| 2011/0189880 A1 | 8/2011 | Bondo |
| 2011/0299708 A1 | 12/2011 | Bondo |
| 2011/0299712 A1 | 12/2011 | Bondo |
| 2011/0311069 A1 | 12/2011 | Ambrose |
| 2012/0014548 A1 | 1/2012 | van Halteren |
| 2012/0027245 A1 | 2/2012 | van Halteren |
| 2012/0140966 A1 | 6/2012 | Mocking |
| 2012/0155683 A1 | 6/2012 | van Halteren |
| 2012/0155694 A1 | 6/2012 | Reeuwijk |
| 2012/0255805 A1 | 10/2012 | van Halteren |
| 2013/0028451 A1 | 1/2013 | de Roo |
| 2013/0136284 A1 | 5/2013 | van Hal |
| 2013/0142370 A1 | 6/2013 | Engbert |
| 2013/0163799 A1 | 6/2013 | Van Halteren |
| 2013/0195295 A1 | 8/2013 | van Halteren |
| 2014/0097906 A1 | 4/2014 | Jennings |
| 2015/0006162 A1 | 1/2015 | Sen |
| 2015/0117675 A1 | 4/2015 | Jennings |
| 2015/0318829 A1 | 11/2015 | Atgimath |
| 2017/0215006 A1 | 7/2017 | van Nieuwkerk |

FOREIGN PATENT DOCUMENTS

| | | |
|---|---|---|
| EP | 3026930 A1 | 6/2016 |
| EP | 2097975 B1 | 8/2018 |

OTHER PUBLICATIONS

Extended European Search Report in Application No. EP 18184775.7, dated Feb. 4, 2019 (14 pages).

Muñiz-Montero, C. et al.; "A 90 μm × 64 μm 225 μW class—AB CMOS differential flipped voltage follower with output driving capability up to 100 pF"; Microelectronics Journal, vol. 44, No. 10, pp. 930-940; XP028757483; ISSN: 0026-2692; DOI: 10.1016/JMEJO.2013.03.002 (11 pages).

Ramirez-Angulo, J. et al.; "Comparison of Conventional and New Flipped Voltage Structures With Increased Input/Output Signal Swing and Current Sourcing/Sinking Capabilities"; Circuits and Systems, 2005, 48$^{th}$ Midwest Symposium; Cincinnati, Ohioh, Aug. 7-10, 2005, Piscataway, US, pp. 1151-1154 (4 pages).

Centurelli, F. et al.; "A Class-AB Flipped Voltage Follower Output Stage"; 2011 20$^{th}$ European Conference on Circuit Theory and Design (ECCTD), Aug. 29, 2011, pp. 757-760; XP031975699; DOI: 10.119/EECTD.2011.6043851; ISBN: 978-1-4577-0617-2 (4 pages).

Extended European Search Report in Application No. EP 18184794.8, dated Jan. 31, 2019 (12 pages).

\* cited by examiner

AMPLIFIER COMPRISING TWO PARALLEL COUPLED AMPLIFIER UNITS

CROSS-REFERENCE TO RELATED APPLICATIONS

This application claims the benefit of European Patent Application Serial No. 18184794.8, filed Jul. 20, 2018, which is incorporated herein by reference in its entirety.

FIELD OF THE INVENTION

The present invention relates to an amplifier with two parallel coupled amplifier units with complementary characteristics and in particular to the parallel coupling of a current sourcing limited amplifier unit and a current sinking limited amplifier unit.

BACKGROUND OF THE INVENTION

Capacitive microphones (both electrets and MEMS types) require built-in buffer amplifiers in order to drive an external load. Traditionally source followers are used for this purpose. The advantages of the source follower are its simplicity, high input impedance, low output impedance, low noise, and the possibility to run on a low supply voltage with low current consumption.

Nonetheless the small signal output impedance, the current drive capability of the source follower is asymmetrical, meaning it can sink a large current from the output, but it can only source a predetermined current to the output, which value is set by the bias current. If the output of a source follower is loaded capacitively, the asymmetry of the source follower will cause non-linearity, which will express itself e.g. by demodulation of ultrasound. This effect will either impose a limit to the capacitive load, and thus limit the possibility of low-pass filtering of the microphone output, or requires a higher bias current setting.

SUMMARY OF INVENTION

Nonetheless the small signal output impedance, the current drive capability of the source follower is asymmetrical, meaning it can sink a large current from the output, but it can only source a predetermined current to the output, which value is set by the bias current. If the output of a source follower is loaded capacitively, the asymmetry of the source follower will cause non-linearity, which will express itself e.g. by demodulation of ultrasound. This effect will either impose a limit to the capacitive load, and thus limit the possibility of low-pass filtering of the microphone output, or requires a higher bias current setting.

Amplifiers may be seen in: US2014097906, US2015117675, US2015318829, US2017215006, U.S. Pat. No. 9,743,167, EP2097975, EP1475996, EP3014613, EP3026930, Muniz-Montero C et al: "A 90 μm×64 μm 225 μW class-AB CMOS differential flipped voltage follower with output driving capability up to 100p", Microelectronics Journal, vol. 44, no. 10, pp 930-940, XP028757483, ISSN: 0026-2692, DOI: 10.1016/JMEJO.2013.03.002, Ramirez-Angulo J et al: "Comparison of conventional and new flipped voltage structures with increased input/output signal swing and current sourcing/sinking capabilities", Circuits and systems, 2005, 48$^{th}$ Midwest symposium on. Cincinnati, Ohio August 7-10 August, 2005, Piscataway, US, 7. August 2005, pp 11151-1154, XP0010895346, DOI: 10.11109/MWSCAS.2005.159310, ISBN: 978-0-7803-9197-0, Francesco Centurelli et al: "A class-AB flipped voltage follower output stage", Circuit theory and design (ECCTD), 2011, 20$^{th}$ European conference on, IEEE, 29 Aug. 2011, pp 757-760, XP031975699, DOI: 10.1109/ECCTD.2011.6043851, ISBN: 978-1-4577-0617-2 and U.S. Pat. No. 9,398,374.

In a first aspect, the invention relates to an amplifier comprising an input and an output, the amplifier comprising:
- a first amplifier unit having a first input connected to the input and a first output connected to the output, and
- a second amplifier unit having a second input connected to the input and a second output connected to the output, where the first and second amplifier units are configured so that:
- the first amplifier unit is configured to receive, at the first output, a first maximum current and to deliver, from the first output, a second maximum current exceeding 1.2 times the first maximum current,
- the second amplifier unit is configured to deliver, from the second output, a third maximum current and to receive at the second output, a fourth maximum current exceeding 1.2 times the third, maximum current,
- when a first current is received by the output, a first portion of the first current received by the second output exceeds a second portion of the first current received by the first output and when a second current is delivered from the output, a third portion of the second current delivered from the first output exceeds a fourth portion of the second current delivered from the second output.

The amplifier has an input and an output. Amplifiers and amplifier units often are configured to receive a signal, such as a signal varying over time, and output another signal with, preferably, the same time variation but which is amplified. Often, the amplification is a voltage amplification were the voltage output is the input voltage times a gain, which may be any positive number. The gain may be 1 (no amplification), lower than 1 (reduction of voltage) or higher than 1 (increasing voltage). Also, the amplifier may be inverting and thus have a negative gain.

Naturally, the amplifier may have multiple inputs and/or multiple outputs. Differential amplifiers, for example, have multiple inputs. Multiple inputs may be used for feed back circuits or the like configuring the behaviour of the amplifier. Inputs may be combined if desired to obtain less inputs, such as one input. The signal input on one input may be fed to the other input in an amended form, such as negated or filtered if desired. An input or an output of an amplifier usually comprises one or more electrical conductors of the amplifier.

The first and second amplifier units may be amplifiers per se, such as buffer amplifiers, i.e. amplifiers outputting a voltage correspond to an input voltage but amplifies the current compared to an input current. Other amplifier unit types amplify an input voltage. Multiple amplifier unit types exist, such as class A, class B, class AB and the like.

The amplifier units have inputs connected to the input, so that both amplifier units receive at least substantially the same signal. Clearly, an input impedance of the first and second amplifier units may vary so that the current received at the first and second inputs may vary, but this may not be desired.

The first and second outputs are connected to the output. Naturally, the outputs may be directly connected, such as galvanically, to the output. Alternatively, the first and second outputs may be connected to a combiner connected to the output. The combiner may be as simple as a resistor allowing the output voltages of the first and second amplifier units to vary.

More complex combiners may be configured to alter between situations where only one amplifier unit outputs a current to the output and where only the other amplifier unit outputs current to the output. Preferably, this alternation takes place in a smooth manner. The switching/altering may simply be controlled by the sign of the voltage output of the amplifier output.

The first amplifier unit is configured to receiving, at the first output, a first maximum current. This maximum current may be set by e.g. a limiter, as described below, which may be external or internal to the first amplifier unit or the amplifier. Often, currents received by an amplifier is fed to ground and thus merely dissipated, so no real current limit exists. This may be changed by using a limiter.

In addition, the first amplifier unit is configured to delivering, from the first output, a second maximum current exceeding 1.2 times the first maximum current. Thus, the first amplifier unit is non-symmetric in the sense that there is a large difference between the currents which may be handled in the two directions.

Clearly, the current output will depend on a load fed by the amplifier output. High impedance loads may not require a large current and thus be less critical as to the capability of the amplifier, but some types of loads have low impedances which will require larger currents in order to operate acceptably. Capacitive loads, such as filters, may have a frequency dependent impedance as described above.

Naturally, the second maximum current may exceed 1.5, such as 2, such as 3, such as 4, such as 5, such as 6, such as 7, such as 8, such as 9, such as 10 times the first maximum current.

Also, the second amplifier unit is configured to deliver, from the second output, a third maximum current and of receiving at the second output, a fourth maximum current exceeding 1.2 times the third maximum current. Thus, also the second amplifier unit is non-symmetric in current behaviour. Naturally, the fourth maximum current may exceed 1.5, such as 2, such as 3, such as 4, such as 5, such as 6, such as 7, such as 8, such as 9, such as 10 times the third maximum current.

The second amplifier unit may be of a type powered by e.g. a battery which usually is limited in the current which may be output to the amplifier unit and thus output from the amplifier, whereas the current received by the amplifier unit may be fed to ground and simply dissipated, whereby there is no real limit to the current which may be received.

The two amplifier units thus have complementary current behaviour. However amplifier units with such behaviour are abundant and easily identified and implemented.

In accordance with the invention, the amplifier has the behaviour that when current is received by the output, the current received by the second output exceeds the current received by the first output. Then, the contribution of the two amplifier units also differs, but in accordance with the capabilities of the amplifier units. Especially when the current received by the amplifier output is high, such as exceeding the first maximum current, the higher current sinking capability of the second amplifier unit is advantageous. When the current received by the output exceeds 2 times the first maximum current, the second output may receive in excess of 1.2 times, such as 1.5 times, such as 2 times, such as 3 times the current received by the first output.

Also, when current is delivered from the output, the amplifier units are configured so that the current delivered from the first output exceeds the current delivered from the second output. For example, when the current delivered from the output exceeds two times the third maximum current, the first output may receive in excess of 1.2 times, such as 1.5 times, such as 2 times, such as 3 times the current received by the second output.

In one embodiment, the first amplifier unit comprises a first power input and a first limiter limiting a current fed from the first output to the first power input to the first maximum current.

The first limiter may be provided outside of the amplifier and may e.g. be a separate component connected to the amplifier. There are, however, possibilities of building such a limiter into the amplifier and thus providing a more compact element.

A limiter may be implemented in a plurality of manners, such as linear and non-linear passive components, active components and the like. A preferred type of limiter is a constant current source which is configured to transmit a current up to a limit, depending on the voltage across the current source. A current source may be implemented as a MOSFET biased to give a constant current. This circuit may be used in an amplifier to control another transistor handling the actual amplification. Also, the circuit may reduce the sensitivity to changes in the power supply voltage.

Also, the current source preferably is configured to shut down (reducing the current transported to 0 A or close to 0 A) in a smooth manner.

In this manner, the first maximum current may be defined or set by the first limiter.

In that or another embodiment, the second amplifier unit comprises a second power input and a second limiter limiting a current fed from the second power input to the second output to the third maximum current. Clearly, the above considerations for the first limiter are equally valid in relation to the second limiter.

In one embodiment, the second and fourth maximum currents are so much larger than the first and third maximum currents that for all practical purposes they may, in the voltage and current regime in which the amplifier is to be used and with the load types (impedances) for which the amplifier is suited, be considered unlimited. Thus, the load may be fed with the current required by the load impedance and the voltage provided on the amplifier output. Then, these contributions to the total current output by the output and received by the output may be considered to be more or less identical. If it is desired to have a highly symmetric current behaviour in the two directions, it is desired that the first and third maximum currents also are rather similar. In one embodiment, the first maximum current is between 0.2 and 5 times, such as between 0.25 and 4 times, such as between 0.3 and 3 times, such as between 0.5 and 2 times the third maximum current.

In one embodiment:
the first amplifier unit has as first output impedance at the first output,
the second amplifier unit has as second output impedance at the second output, and
the first output impedance is between 0.2 and 5 times, such as between 0.25 and 4 times, such as between 0.3 and 3 times, such as between 0.5 and 2 times the second output impedance.

The output impedance of the two amplifier units will also play a role in the distribution of current to/from the first and second outputs.

As the amplifier is desired used for amplifying the output of small transducers, such as vibration sensors or microphones, such as MEMS microphones, it is desired that the amplifier, at the input, has an input impedance which exceeds 1 GOhm, such as 5 GOhm, such as 10 GOhm, such as 100 GOhm, such as 1 TOhm, and/or that the amplifier, at the input, has an input capacitance at input lower than 2 pF, such as 1 pF, such as 500 fF, such as 250 fF, such as 100 fF.

In general, the first and the second amplifier units may each be formed by any number of amplifying circuits, such as transistors. In a preferred embodiment, each amplifier unit comprises only a single amplifying element such as a single transistor, such as a MOSFET. A single transistor may exist between the input and the output of an amplifying unit. Multiple parallel transistors may be used if desired.

In one embodiment, the amplifier further comprising:
 a first power input conductor connected to both the first and the second amplifier unit,
 a second power input conductor connected to both the first and the second amplifier unit,
 wherein the first and second amplifier units are configured to output voltages of at least 80% of a voltage applied between the first and second power input conductors.

Often, power is supplied to an amplifier via two conductors which are, usually, to be connected to a higher voltage and a lower DC voltage, respectively, where the lower voltage often is ground. In this embodiment, the two amplifier units are both fed by the same conductors and thus power supply when connected to a power supply. Both amplifier units thus may be fed with the same voltage, even though the currents fed to the amplifier units may vary.

Amplifiers and amplifier units usually have internal power consumption which limits the voltage which may be output compared to the voltage fed to the amplifier. Often, a 10-20% reduction is seen from the supply voltage to the maximum voltage which the amplifier may receive and/or output without reaching a limit.

When the amplifier units are both configured to output at least 80%, such as at least 90%, of the voltage applied between the conductors, the amplifier units may provide, at their outputs, at least substantially the same voltage. Then, it may be ensured that the amplifier units output the same voltage, so that the current flows in the same direction in the amplifier units.

In one embodiment:
 when the first amplifier unit outputs, from the first output, a current equal to the third maximum current, the second amplifier unit outputs, from the second output, a current exceeding 0.2 times the third maximum current and
 when the second amplifier unit receives, on the second output, a current equal to the first maximum current, the first amplifier unit receives, on the first output, a current exceeding 0.2 times the first maximum current.

Naturally, the combined output of the amplifier will depend on the matching of the first and second amplifier units. This is one manner of matching the amplifier units on the basis of the region around OA. As mentioned above, the second and fourth maximum currents may be more or less unlimited, so that these need not be taken into account when matching the amplifier units.

However, the region around OA is where the current transitions from the limited current direction to the less or unlimited direction.

In this embodiment, it is desired that the current output, in this region, is rather similar. Clearly, at higher currents, the difference in the currents delivered/received by the amplifier units will increase. Often, the largest difference will be at the largest currents, so that for even smaller currents, the currents delivered/received by the amplifier units may be closer.

However, in the region between where the first amplifier unit outputs a current equal to the third current and the second amplifier unit receives a current equal to the first current, the currents delivered by or received by the amplifier units preferably differs only by a factor of 5, such as a factor of 4, such as a factor of 3, such as a factor of 2. In this manner, the transition of the amplifier units between the state of delivering current to the state of receiving current takes place in a smooth manner.

In one embodiment, a gain, such as a voltage gain, of the first amplifier unit is between 0.5 and 2 times, such as between 0.6 and 1.8 times, such as between 0.7 and 1.4 times, such as between 0.8 and 1.2 times, such as between 0.9 and 1.1 times a gain of the second amplifier unit. Preferably, the same signal, and thus the same voltage, is fed to the inputs of the two amplifier units, and it is desired that the output voltages of the two amplifier units do not differ too much, as this will have an impact on the currents to be supplied, and as it also complicates the combination of the signals output of the two amplifier units.

In one embodiment, the amplifier has a constant gain for all input voltages and output voltages below a threshold voltage.

Amplifiers and amplifier units preferably have a fixed gain over all output voltages, but are often limited in a number of manners. Usually, an amplifier is not capable of outputting a voltage higher than a supply voltage thereof, or (cf above) a percentage thereof, such as 80% or 90% thereof. In the present context, if the amplifier (unit) is fed by the power source which is able to output a predetermined maximum voltage, the threshold voltage would be at least 80%, such as at least 90% of that voltage. This maximum voltage may be set or caused by the power source itself, such as the voltage capabilities of a battery.

However, due to the advantageous combination of amplifier units with the behaviour described, the gain may be constant, such as within 10% or even within 5% over the threshold voltage range.

Another aspect of the invention relates to an amplifier according to the first aspect and a load connected to the output.

As mentioned, the load may take many shapes. The load may be a filter, a sound generator, a signal processor or the like. The load may have a purely resistive impedance, a purely capacitive impedance or a mixture thereof. In many situations, the impedance is frequency dependent, which may pose additional challenges.

Then, it may be desired that the current behaviour of the amplifier is symmetric in the sense that the current output is the same, or at least substantially, independently of the sign of the voltage provided on the amplifier output. Thus, in one situation, for each voltage, between 0V and a predetermined maximum voltage, provided on the output, a current fed to the load from the output is between 0.8 and 1.2 times, such as between 0.9 and 1.1 times, or between 0.8 and 1.1 times, or between 0.9 and 1.2 times, such as between 0.95 and 1.05 times, such as between 0.8 and 1 times, such as between 1 and 1.2 times, a current received by the output when the predetermined maximum voltage, negative, is provided on the output.

The present maximum voltage may be a voltage set by the amplifier or a particular use situation. Often, however, the maximum voltage is defined by or in relation to a power supply, as is described above.

In this context, the negative maximum voltage is the same voltage with the opposite sign. Thus, if the "maximum voltage" is a negative voltage, the "negative, maximum voltage" will be a positive voltage with the same absolute value.

Another aspect of the invention relates to an assembly of an amplifier according to the first aspect, or an assembly according to the second aspect, and a transducer, such as a capacitive transducer, connected to the input of the amplifier. The transducer may be a vibration sensor, a microphone, such as a MEMS microphone, or the like.

A last aspect of the invention relates to a personal audio device, such as a hearable, a hearing instrument, a hearing aid, an earphone or the like, comprising an amplifier according to the first aspect or an assembly according to the second aspect of the invention.

BRIEF DESCRIPTION OF THE DRAWINGS

In the following, preferred embodiments will be described with reference to the drawing, wherein.

DETAILED DESCRIPTION OF THE INVENTION

Figure 4:
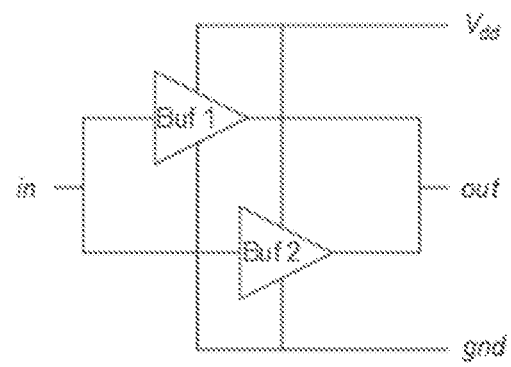
FIG. 4 illustrates a first embodiment of an amplifier according to the invention.

FIG. 4 illustrates a generic embodiment of the invention where two amplifier units Buf1 and Buf2 are both connected to an input In and an output out. Both amplifier units receive power from two conductors presently represented by Vdd and Ground.

The amplifier units Amp1/Amp2 have, for this example, inverted characteristics so that the amplifier unit Amp2 is current limited when the output signal requires current to be received by the output, such as when a voltage of the output signal is negative. Thus, the amplifier unit Amp2 is configured to receive, at a given voltage, when a maximum voltage causes a maximum current (such as a maximum obtainable output voltage), a first current, whereas it is able to deliver a second, higher current, when the output voltage is positive.

Conversely to that, the amplifier unit Amp1 is current limited when the output signal requires current to be delivered from the output out, such as when a voltage of the output signal is positive. Thus, the amplifier unit Amp1 is configured to deliver, at a given voltage (such as a maximum obtainable output voltage) a third current, whereas it is able to receive a fourth, higher current, when the output voltage is negative.

The basic idea is to combine an amplifier unit (Amp1), which is configured to source a large current to a load connected to the output out, but sinking a limited current from the load, with another amplifier unit (Amp2) which is configured to sink a large current from the load. The two complementary buffer amplifiers or amplifier units are connected in parallel at their inputs and at their outputs.

When combining the output of the two amplifier units, the combined current will be the sum of the first and fourth currents and the sum of the second and third currents. Thus, the amplifier units may be selected or paired so that these sums give the sought after symmetry or behaviour. Clearly, the maximum currents of the amplifier units may be different, as long as the combination gives the desired overall current behaviour. It may be easier to design a circuit where the first and third currents are at least substantially the same and where the second and fourth currents are at least substantially the same. On the other hand, there may be a large difference between the first/third currents and the second/fourth currents.

The outputs of the amplifier units are connected to the output of the overall amplifier. Naturally, the outputs may be directly connected, such as galvanically, to the output. Alternatively, the first and second outputs may be connected to a combiner connected to the output. The combiner may be as simple as a resistor allowing the output voltages of the first and second amplifier units to vary. The combiner may additionally perform a smooth transition from when the output from only one amplifier unit is connected to the output to when the output of only the other amplifier unit is connected to the output. The switching/transition may simply be controlled by the sign of the voltage output from the output, as this identifies the direction of the current on the output. Again, the amplifier units or their characteristics may be selected to arrive at the sought after symmetry.

Figure 1:
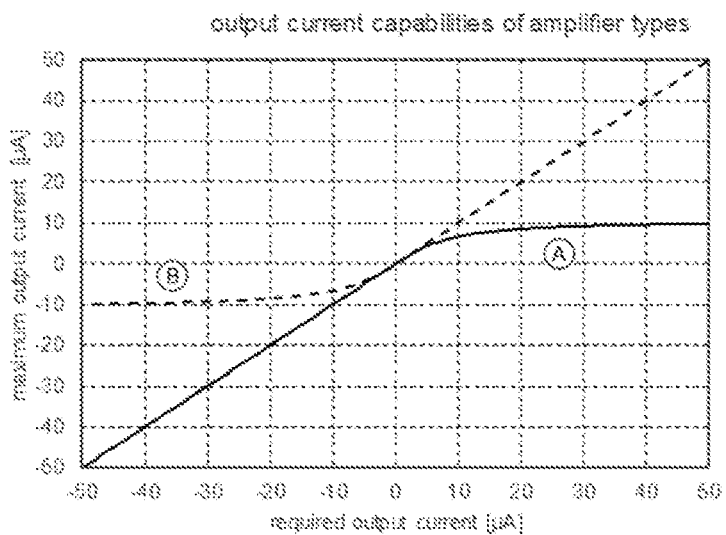
FIG. 1 illustrates the output current capabilities of two amplifier units.

FIG. 1 illustrates the characteristics of two amplifier units with complementary, actually inverted, characteristics. The graph shows the output current drive capabilities of the two amplifier unit types. Amplifier unit 2 (marked with "A"), is e.g. a source follower, biased with 10 µA, which is configured to source up to 10 µA and to sink more current. Amplifier unit 1 (marked with "B") is a complementary type, configured to sink up to 10 µA, and of sourcing more current.

This means that either amplifier unit type has a region where the maximum output current is smaller than the required output current, so that slewing may occur, such as when a capacitive load is connected, where the output voltage then is non-linearly distorted from each individual amplifier unit.

Figure 2:
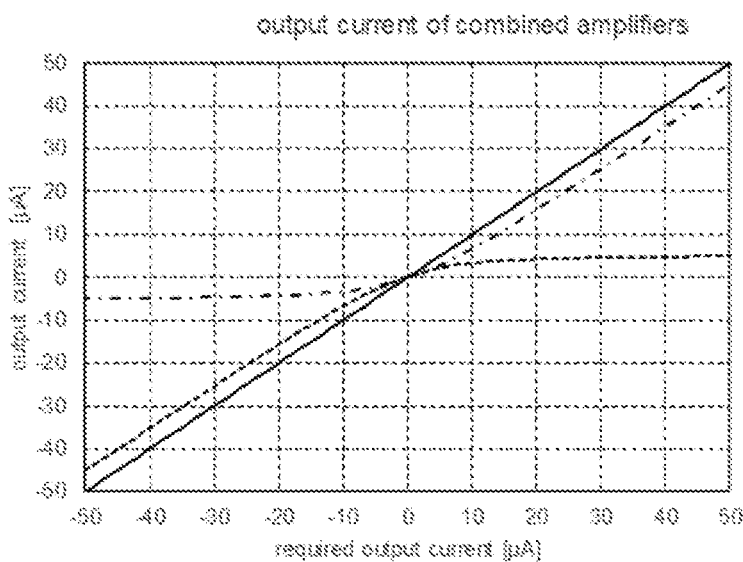
FIG. 2 illustrates a result of a parallel coupling of two amplifier units.

FIG. 2 illustrates a graph showing the actual output current of an amplifier that is composed of parallel connected Amp1 type and Amp2 type amplifier units.

Both amplifier units deliver an actual output current that is smaller than the amplifier's maximum output current capability, while the sum of both actual output currents equals the required output current.

This means the combined amplifier can deliver any required output current, and the output voltage will not be distorted.

Figure 3:
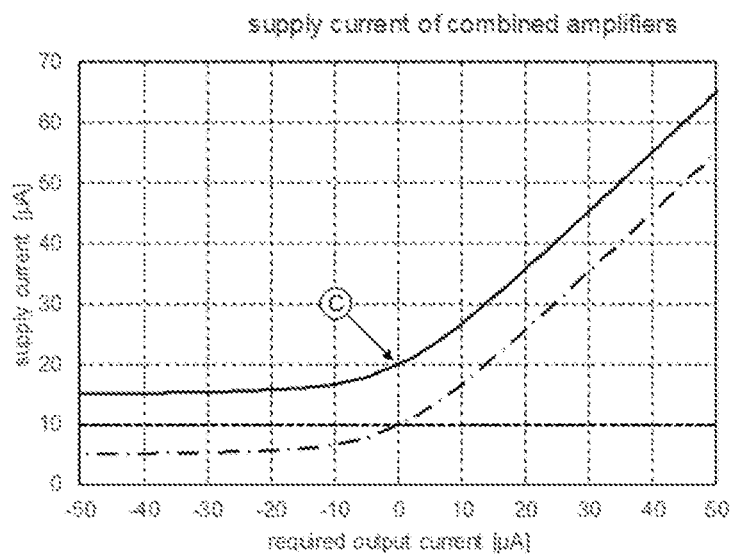
FIG. 3 illustrates the supply current of parallel coupled amplifier units.

FIG. 3 illustrates a graph showing the current drawn from the power supply (Vdd; cf FIG. 4). It may be clear that the supply current of Amp2 always equals its bias current (10 µA in this example), while the supply current of Amp1 can vary between a value that is lower than its bias current (approx. 5 µA this example) and the current available from the external power source.

For small signals, the required output current is close to zero, and the supply current will equal the quiescent current level (marked with "C"), which is the sum of the bias currents of both buffers.

Figure 5:
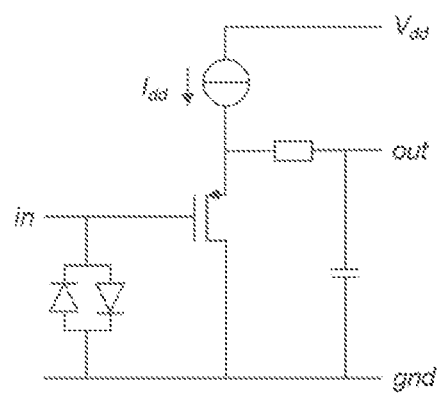
FIG. 5 illustrates an amplifier unit with a sourcing limitation.

Clearly, the amplifier units Amp1 and Amp2 need not be of the same type or same technology, In FIG. 5, an amplifier unit is illustrated with characteristics similar to those of Amp2 in FIG. 1, i.e. an amplifier unit which is limited in the current delivered to the output, due to the limitation of the current source Idd, but not in the current received from the output, which current may be fed directly to ground.

Figure 6:
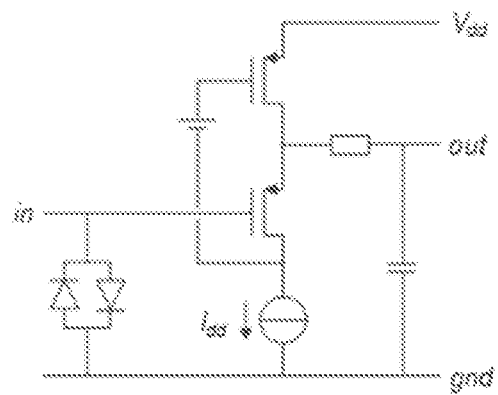
FIG. 6 illustrates an amplifier unit with a sinking limitation.

In FIG. 6, an example is illustrated of an amplifier unit with characteristics similar to those of Amp1 in FIG. 1, i.e. which is configured to source a large current. This is in the form of folded source follower. In this circuit, the drain current of the P-type MOSFET is determined by a current source or current limiter Idd, and a feedback path provides the supply current. In order to maximize the output voltage swing, a level shifter is provided in the feedback path.

For the implementation of the level shifter, there are several possibilities, which will not be elaborated here.

A current limiter may be implemented in a number of manners. A suitable current limiter type often used in amplifier units is a constant current source.

The constant current source is a well known element for MOSFET integrated circuits. The advantage is that it can be used to provide a current that is to a high degree independent of the supply voltage level, and the operating temperature, and production variance. Also the feedthrough of any noise from the supply connection can be greatly reduced. Such independency may be obtained by generating the required bias voltage for a MOSFET current source by means of a reference circuit that can be integrated in the same integrated circuit die as the other elements of the amplifier. Alternatively, a self-biased configuration can be used for a constant current source.

Thus, due to the current limiter Idd, the current which may be received on the output is limited, whereas the current output from the output may be derived directly from the Vdd supply.

Figure 7:
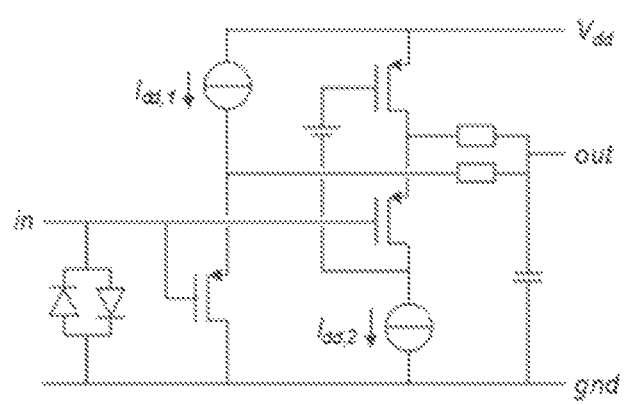
FIG. 7 illustrates a combination of the amplifier units from FIGS. 5 and 6.

The circuits of FIGS. 5 and 6 may thus be connected in parallel. This is seen in FIG. 7. Here, both amplifier units are biased at the same Idd, the DC-voltage at their outputs is the same, so that no DC-current will flow through the filter resistors.

The proposed circuit can also be used without a capacitive load, when a low impedance resistive load must be driven, and still a low quiescent current is required.

The invention claimed is:

1. An amplifier comprising an input and an output, the amplifier comprising:
   a first amplifier unit having a first input connected to the input and a first output connected to the output, and
   a second amplifier unit having a second input connected to the input and a second output connected to the output,
   where the first and second amplifier units are configured so that:
   the first amplifier unit is configured to receive, at the first output, a first maximum current and of delivering, from the first output, a second maximum current exceeding 1.2 times the first maximum current,
   the second amplifier unit is configured to deliver, from the second output, a third maximum current and of receiving at the second output, a fourth maximum current exceeding 1.2 times the third maximum current,
   when a first current is received by the output, a first portion of the first current received by the second output exceeds a second portion of the first current received by the first output and
   when a second current is delivered from the output, a third portion of the second current delivered from the first output exceeds a fourth portion of the second current delivered from the second output.

2. An amplifier according to claim 1, wherein the first amplifier unit comprises a first power input and a first limiter limiting a current fed from the first output to the first power input to the first maximum current.

3. An amplifier according to claim 1, wherein the second amplifier unit comprises a second power input and a second limiter limiting a current fed from the second power input to the second output to the third maximum current.

4. An amplifier according to claim 1, wherein the first maximum current is between 0.2 and 5 times the third maximum current.

5. An amplifier according to claim 1, wherein:
   the first amplifier unit has as first output impedance at the first output,
   the second amplifier unit has as second output impedance at the second output, and
   the first output impedance is between 0.2 and 5 times the second output impedance.

6. An amplifier according to claim 1, wherein the amplifier, at the input, has an input impedance which exceeds 1 GOhm.

7. An amplifier according to claim 1, wherein the amplifier, at the input, has an input capacitance at input lower than 2 pF.

8. An amplifier according to claim 1, further comprising:
   a first power input conductor connected to both the first and the second amplifier units,
   a second power input conductor connected to both the first and the second amplifier units,
   wherein the first and second amplifier units are configured to output voltages of at least 80% of a voltage applied between the first and second power input conductors.

9. An amplifier according to claim 1, wherein:
   when the first amplifier unit outputs, from the first output, a current equal to the third maximum current, the second amplifier outputs, from the second output, a current exceeding 0.2 times the third maximum current and
   when the second amplifier unit receives, on the second output, a current equal to the first maximum current, the first amplifier receives, on the first output, a current exceeding 0.2 times the first maximum current.

10. An amplifier according to claim 1, wherein a (voltage) gain of the first amplifier unit is between 0.5 and 2 times a gain of the second amplifier unit.

11. An amplifier according to claim 1, having a constant gain for all input voltages and output voltages below a threshold voltage.

12. An assembly comprising an amplifier according to claim 1 and a load connected to the output.

13. An assembly according to claim 12, wherein the amplifier is configured to, for each voltage, between 0V and a predetermined maximum voltage, provided on the output, feed a current to the load from the output between 0.8 and 1.2 times a current received by the output when the predetermined maximum voltage, negative, is provided on the output.

14. An assembly of a transducer and an amplifier according to claim 1, wherein the transducer is connected to the input.

15. A personal audio device comprising an amplifier according to claim 1.

16. A personal audio device comprising an assembly according to claim 12.

17. An amplifier according to claim 2, wherein the amplifier, at the input, has an input impedance which exceeds 1 GOhm.

18. An amplifier according to claim 3, wherein the amplifier, at the input, has an input impedance which exceeds 1 GOhm.

19. An amplifier according to claim 4, wherein the amplifier, at the input, has an input impedance which exceeds 1 GOhm.

20. An amplifier according to claim 5, wherein the amplifier, at the input, has an input impedance which exceeds 1 GOhm.

* * * * *